United States Patent
Knippelmeyer

(10) Patent No.: US 7,105,814 B2
(45) Date of Patent: Sep. 12, 2006

(54) ELECTRON MICROSCOPY SYSTEM AND ELECTRON MICROSCOPY METHOD

(75) Inventor: Rainer Knippelmeyer, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 273 days.

(21) Appl. No.: 10/636,626

(22) Filed: Aug. 8, 2003

(65) Prior Publication Data

US 2004/0075054 A1    Apr. 22, 2004

(30) Foreign Application Priority Data

Aug. 9, 2002 (DE) ................. 102 36 738

(51) Int. Cl.
*H01J 37/28* (2006.01)

(52) U.S. Cl. ............... 250/310; 250/307; 250/305

(58) Field of Classification Search ............... None
See application file for complete search history.

(56) References Cited

U.S. PATENT DOCUMENTS

| | | | |
|---|---|---|---|
| 4,740,704 A | 4/1988 | Rose et al. | |
| 4,803,357 A | 2/1989 | Brust | |
| 4,933,552 A | 6/1990 | Lee | |
| 4,978,855 A * | 12/1990 | Liebl et al. | 250/310 |
| 5,097,127 A | 3/1992 | Hildenbrand et al. | |
| 5,644,132 A | 7/1997 | Litman et al. | |
| 5,659,172 A | 8/1997 | Wagner et al. | |
| 5,969,356 A | 10/1999 | Grzelakowski | |
| 6,184,526 B1 | 2/2001 | Kohama et al. | |
| 6,310,341 B1 * | 10/2001 | Todokoro et al. | 250/305 |
| 6,498,345 B1 | 12/2002 | Weimer et al. | |
| 2003/0066961 A1 | 4/2003 | Kienzle et al. | |

FOREIGN PATENT DOCUMENTS

| | | |
|---|---|---|
| DE | 196 47 975 A1 | 5/1997 |
| EP | 0917177 A1 | 5/1999 |
| EP | 0 969 495 A2 | 1/2000 |
| EP | 1 280 184 A2 | 1/2003 |
| JP | 2000286310 A | 10/2000 |
| WO | 00/70646 | 11/2000 |

* cited by examiner

*Primary Examiner*—Jack I. Berman
(74) *Attorney, Agent, or Firm*—Jones Day

(57) ABSTRACT

A probe-forming electron microscopy system 1 (SEM) is proposed which comprises a position-sensitive detector 15. As a result, position-dependent secondary electron intensities in the object plane 7 or angle-dependent secondary electron intensities in the object plane 7 may be observed.

18 Claims, 5 Drawing Sheets

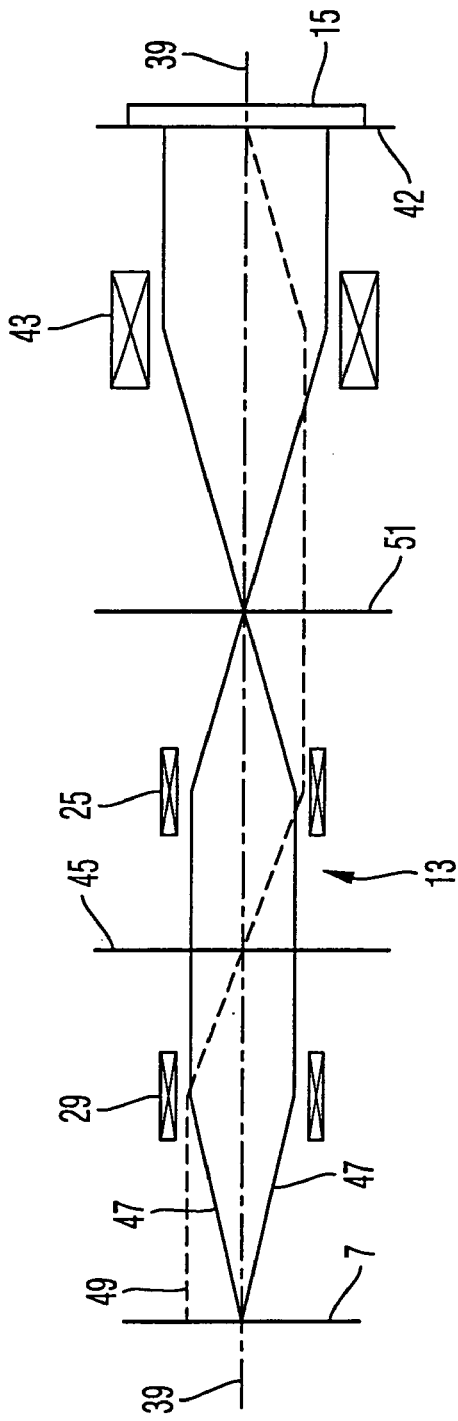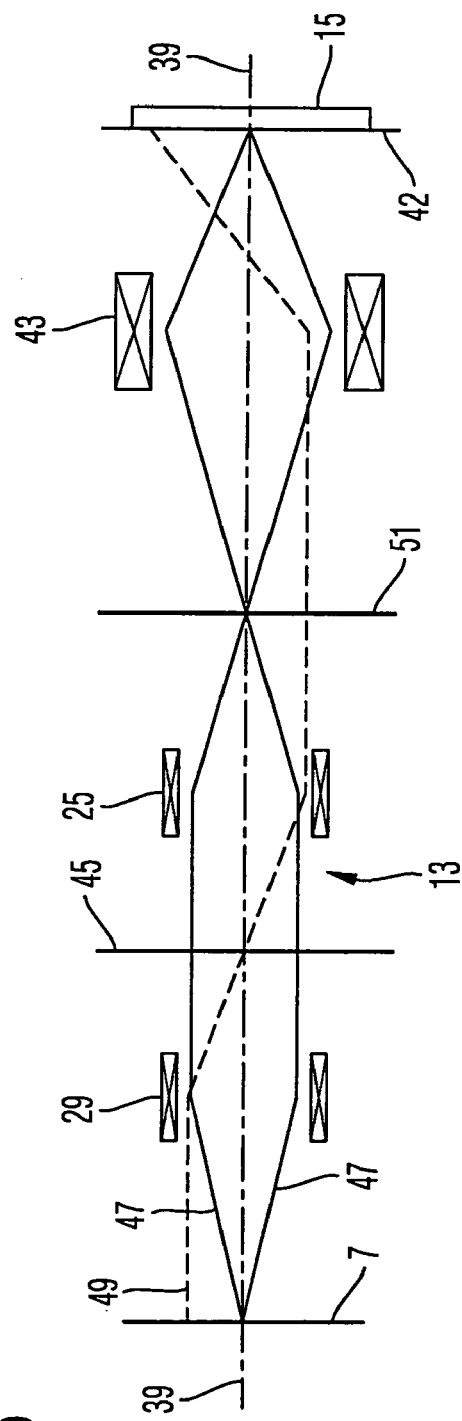

ELECTRON MICROSCOPY SYSTEM AND ELECTRON MICROSCOPY METHOD

This application is based upon DE 102 36 738.8 filed on Aug. 9, 2002, the entire contents of which are incorporated herein by reference.

BACKGROUND OF THE INVENTION

1. Field of the Invention

The invention relates to an electron microscopy system for electron-microscopically obtaining information about a structure of an object. The invention further relates to a method for obtaining such information.

2. Brief Description of Related Art

Electron microscopes of the SEM type (scanning electron microscope) are known from the prior art.

In an electron microscope of the SEM type, a finely focused probe-forming primary electron beam is scanned across the object surface, and an integral secondary electron intensity is detected in dependence of a location of a beam spot formed by the finely focused primary electron beam in the object plane in order to obtain an electron-microscopic image of the object. In such an electron microscope, the achievable position resolution of the image is restricted substantially by a diameter of the beam spot of the primary electron beam in the plane of the object surface. The secondary electrons are detected integrally, i.e., position-independent. The detected secondary electron intensity is allocated to a location on the object to obtain a two-dimensionally position-resolving electron-microscopic image of the object. The position to which a detected secondary electron intensity is allocated in the image corresponds to the location on the object surface to which the primary electron beam is focused. The knowledge of this location and of changes of this location, respectively, is essential for the position resolution of the obtained image.

In the electron microscopy of the SEM-type there is usually provided a deflecting system in the beam path of the primary electrons in order to displace the primary electron beam away from an optical axis of an objective lens of the microscope. It is also possible to displace the sample relative to an objective lens of the electron microscope in a known or predetermined manner.

Since the secondary electron intensity is detected integrally and since the position information in the electron-microscopic image is obtained on account of the knowledge of the location of the primary electron beam spot in the object plane, the conventional electron microscope of the SEM type does not comprise a position-sensitive detector.

Applications of the electron microscope of the SEM-type are well known in the art. Two adjacent portions of the object differing in their efficiency to generate secondary electrons from incident primary electrons result in a contrast in the image, and the information which can be gained about an object by using the electron microscope of the SEM-type is limited to such structures which show differences in their secondary electron generation efficiencies.

SUMMARY OF THE INVENTION

It is an object of the present invention to provide an electron microscope similar to the SEM-type microscope which allows for obtaining additional information on an inspected object. It is a further object of the present invention to provide a corresponding method of operating an electron microscope.

The invention starts from an electron microscope of a the SEM type, i.e., an electron microscopy system comprising an electron source for generating a primary electron beam, a primary electron optics with an objective lens for focusing the primary electron beam at substantially a focal point in the object plane, an electron detector for detecting an electron intensity and a secondary electron optics which comprises the objective lens and serves for transferring the secondary electrons emanating from a region around the focal point as secondary electron beam to the detector.

In one aspect of the invention, the inventors have found that additional structure information about the object to be inspected may be obtained with such an electron microscopy system if a two-dimensionally position-sensitive detector is used as the electron detector.

This is based on the consideration that secondary electrons which are generated by the focused primary electrons, which are focused in the object plane to a region which is point-shaped, in the ideal case, have a spatial and angular distribution, the detection of which allows recording further information on the structure of the object.

The provision of the position-sensitive detector in the electron microscope of the SEM-type and an analysis of the electron image detected by the detector allow to obtain further information on that point of the object at which the primary electron beam spot is formed.

In this respect, it is further advantageous for an energy filter to be disposed in the beam path of the secondary electron beam so that only secondary electrons with a kinetic energy of a specific range are supplied to the detector.

Preferably, the secondary electron optics can be provided such that the object plane is imaged substantially sharply (substantially in focus) on the electron detector by means of the secondary electron beam. It is then possible to examine a position distribution with which the secondary electrons emanate in a surrounding area of the primary electron beam spot from the material of the inspected object. Such a position distribution may provide further information about the position-dependent structures of the inspected object.

As an alternative to this, it is advantageous for a diffraction plane conjugated to the object plane in the beam path of the secondary electrons to be imaged substantially sharply on the electron detector by means of the secondary electron beam. The secondary electron intensity detected position-dependently on the electron detector is then representative of an angular distribution of the secondary electrons in the object plane. This angular distribution of the secondary electrons provides additional valuable information on the structure of the inspected object.

In another aspect of the invention, a high quality secondary electron beam path can be provided in the electron microscope of the SEM-type comprising a secondary electron detector having a plurality of detector pixels.

In order to supply the secondary electrons to the electron detector with an improved imaging quality, the electron microscopy system comprises a beam splitter to separate the primary electron beam and the secondary electron beam from each other. The secondary electron beam can then be manipulated by means of electron-optical components acting on the secondary electron beam and not on the primary electron beam to improve an accuracy of secondary electron detection.

The electron optical components to improve the accuracy of secondary electron detection include a beam deflector located downstream of the beam splitter to compensate for influences which a deflection of the primary electron beam spot relative to the objective lens will have on the beam path of the secondary electron beam.

Within the scope of the present application, the term "secondary electrons" includes, among others, mirror electrons which are primary electrons reflected at the object and which do not reach the surface of the object. Moreover, the term also includes backscattering electrons which are electrons emitted from the surface of the object and, according to a common definition, have an energy of more than 50 eV. Moreover, the term also includes secondary electrons in the narrower sense, i.e., such electrons emitted from the object which are generated by the primary electrons and have a kinetic energy of less than 50 eV.

Preferably, the secondary electron optics can be switched from an operating mode in which the object plane is imaged substantially sharply on the electron detector to a further operating mode in which the diffraction plane is imaged substantially sharply on the electron detector. Accordingly, the system can be switched from an operating mode for the position-resolved observation of the surroundings of the primary electron beam spot and a further operating mode for the observation of the angular distribution of the secondary electrons generated at the primary electron beam spot. To this end, the secondary electron optics preferably comprises, apart from the objective lens as such, at least one further imaging lens.

Although the primary electron beam spot on the inspected object may be displaced by moving the object relative to the objective lens, the primary electron optics is preferably provided such that it comprises a deflector for deflecting the primary electron beam relative to the objective lens.

Preferably, the electron microscopy system comprises a controller for allocating the secondary electron intensities detected by the electron detector to positions of the object.

In another aspect of the invention there is provided a scanning-electron-microscopy-type apparatus providing a primary electron beam path and a secondary electron beam path. The apparatus comprises an electron source. The apparatus also comprises a beam splitter, an objective lens, and a first beam deflector, each disposed in the primary electron beam path and in the secondary electron beam path. The apparatus also comprises a second beam deflector and an electron detector, each disposed in the secondary electron beam path and outside the primary electron beam path. The apparatus also comprises a controller for operating the second deflector in dependence on a deflection provided by the first deflector.

In another aspect of the invention there is provided method for inspecting an object to obtain structure information of the object. The method comprises generating a primary electron beam spot on the object by directing a finely focused primary electron beam onto the object, obtaining a secondary electron image with a two-dimensionally position-sensitive detector, and obtaining the structure information from the secondary electron image, the structure information corresponding to a location of the primary electron beam spot at a given time.

In another aspect of the invention there is provided a method for inspecting an object. The method comprises generating a primary electron beam spot on the object by directing a primary electron beam onto the object through an objective lens, detecting intensities of a secondary electron beam emanating from the primary electron beam spot with a detector, deflecting the primary electron beam relative to the objective lens, and deflecting the secondary electron beam relative to the detector in dependence on a deflection of the primary electron beam. The deflection of the secondary electron beam can compensate for a deterioration of the detected intensities caused by the deflection of the primary electron beam.

In another aspect of the invention there is provided a scanning-electron-microscopy-type apparatus. The apparatus comprises a source of primary electrons. The apparatus also comprises a beam splitter, an objective lens, and a first beam deflector, each disposed to receive the primary electrons and to receive secondary electrons emanating from an object impinged by the primary electrons. The apparatus also comprises a second beam deflector and an electron detector, each disposed to receive the secondary electrons and not to receive the primary electrons. The apparatus also comprises a controller for operating the second beam deflector in dependence on a deflection of the primary electrons provided by the first beam deflector.

In another aspect of the invention there is provided a method for inspecting an object. The method comprises generating primary electrons and directing the primary electrons onto an object through an objective lens, detecting intensities of secondary electrons emanating from the object impinged by the primary electrons, deflecting the primary electrons relative to the objective lens with a first beam deflector, and deflecting the secondary electrons relative to the detector with a second beam deflector in dependence on a deflection of the primary electrons.

BRIEF DESCRIPTION OF THE DRAWINGS

The forgoing as well as other advantageous features of the invention will be more apparent from the following detailed description of exemplary embodiments of the invention with reference to the accompanying drawings, wherein:

FIGS. 2a and 2b schematically show beam paths through the electron microscopy system shown in FIGS. 1a and 1b in the two settings;

DESCRIPTION OF EXEMPLARY
EMBODIMENTS

Figure 1A:
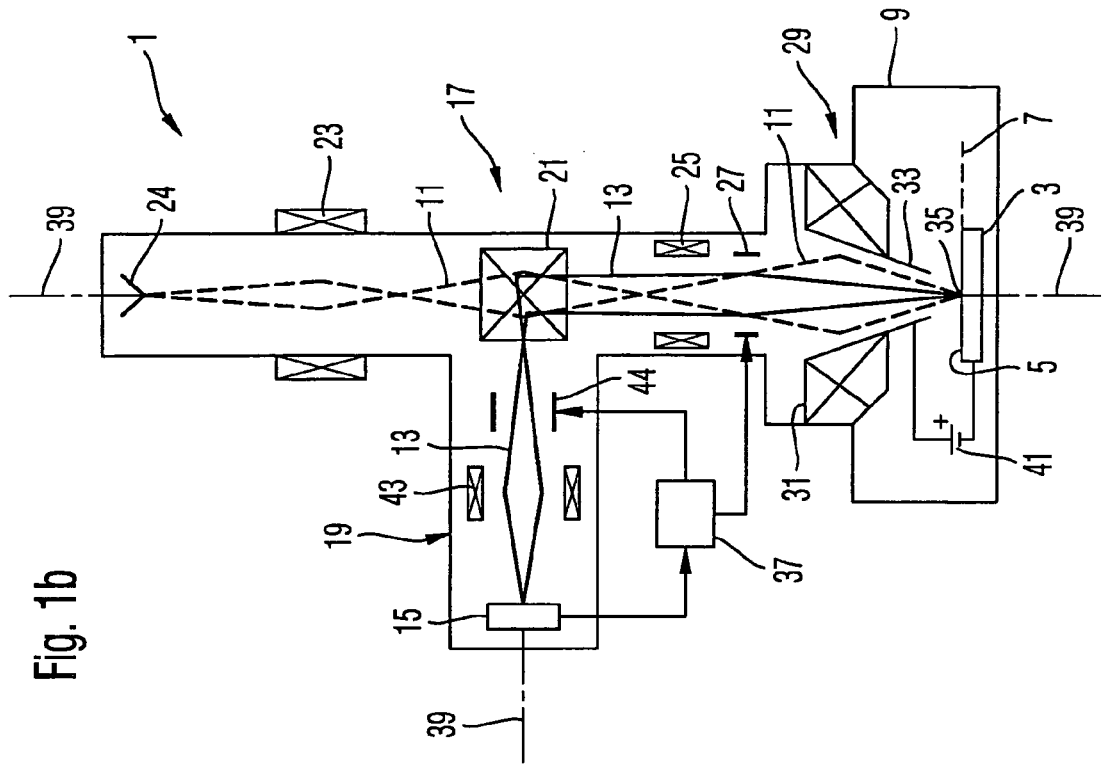
FIGS. 1a and 1b schematically show an embodiment of the electron microscopy system according to the invention in two different settings.
Figure 1B:
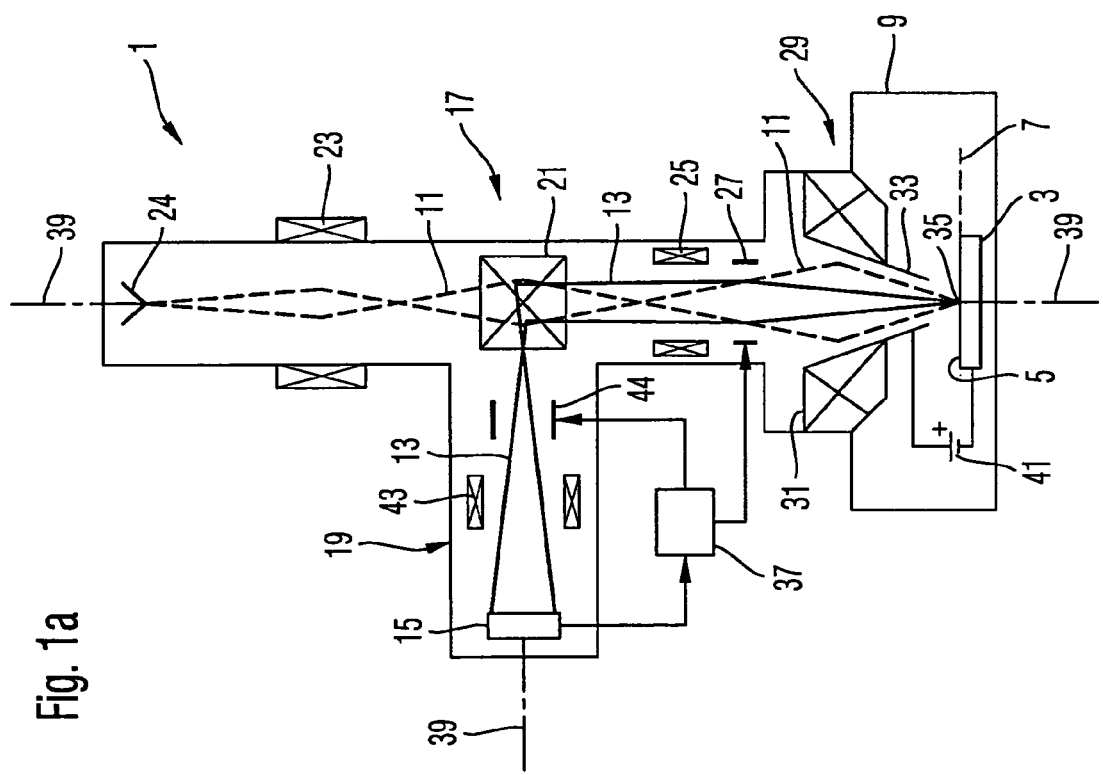

An electron microscope 1 schematically shown in FIGS. 1a and 1b is used to generate an electron-microscopic image of an object to be inspected, such as a semiconductor wafer 3. A surface 5 of the object 3 is disposed in an object plane 7 of the electron microscope 1 in a sample chamber 9. The electron microscope 1 directs a primary electron beam 11 onto the surface 5 of the semiconductor wafer 3, and secondary electrons emanating from a region about the object plane 7 are directed as secondary electron beam 13 to a position-sensitive detector 15 of the electron microscope 1. The secondary electron intensities detected by the detector and, in particular, dependency of the detected intensities provide structure information about the object 3 detected by the electron microscopy system 1.

To this end, the electron microscope 1 comprise primary electron optics 17 for guiding the primary electron beam 11, and secondary electron optics 19 for guiding the secondary electron beam 13. The primary electron optics 17 and the secondary electron optics 19 comprise a beam splitter 21 for separating the primary and secondary electron beams 11, 13 from each other. Between the beam splitter 21 and the object plane 7, the primary and secondary electron beams 11, 13 travel superimposed on each other; between the beam splitter 21 and the electron detector 15, the secondary electron beam 13 is separated form the primary electron beam 11.

The primary electron optics 17 successively comprises an electron source 24 for generating the primary electron beam 11, a collimating lens 23 for collimating the primary beam 11, the beam splitter 21, a beam-shaping lens 25, a beam deflector 27 and an objective lens arrangement 29 with a magnetic focusing lens 31 and an extraction electrode 33 having also a focusing effect on the primary electron beam 11.

The primary electron beam 11 is focused in the object plane 7 at a focal point 35 by means of the objective lens arrangement 29. The focal point 35 is of course no ideal point in a mathematical sense, but an extended spot having a diameter of up to a few nm. For instance, a low resolution SEM-type microscope can generate a beam spot of about 500 nm, a medium resolution microscope can generate a beam spot of about 100 nm, a higher resolution microscope can form a beam spot of about 50 nm which may come down to 10 nm or 5 nm or less for high resolution microscopes. Thus, according to the present invention, a diameter of a primary electron beam spot can be, for example, less than 500 nm, or less than 100 nm, or less than 50 nm, or less than 10 nm, or less than 5 nm.

The beam deflector 27 is controlled by a controller 37 in order to displace the primary electron beam 11 away from an optical axis 39 of the objective arrangement 29 and to thus displace the focal point 35 and the primary electron beam spot in the object plane 7.

In order to guide the secondary electrons as secondary electron beam 13 from the object plane 7 to the detector 15, the secondary electron optics 19 comprise the extraction electrode 33 for providing an adjustable electric extraction field between the object 3 and the electrode 33 which accelerates the secondary electrons. Moreover, the secondary electron optics 19 comprise the magnetic focusing lens 31, the intermediate lens 25, the beam splitter 21 for separating the beam path of the secondary electron beam 13 from the primary electron beam 11, a projecting lens 43, and the position-sensitive electron detector 15.

The projecting lens 43 is controllable by the controller 37 for switching the electron microscope 1 between two operating modes.

In a first operating mode shown in FIG. 1a, a diffraction plane of the secondary electron beam path disposed in the objective arrangement 29 is imaged substantially sharply (substantially in focus) on a radiation-sensitive surface of the electron detector 15 in order to resolve an angle distribution of secondary electrons as it will be illustrated hereinafter in further detail. In the second operating mode shown in FIG. 1b, the object plane 7 is imaged substantially sharply on the position-sensitive detector 15 for observing a position dependency of the secondary electron intensity generated in a region about the primary electron beam spot as it will be illustrated hereinafter.

To this end, the beam paths corresponding to the two operating modes of FIGS. 1a and 1b are schematically shown in FIGS. 2a and 2b in a non-folded form. FIG. 2b shows the operating mode corresponding to FIG. 1b in which the object plane 7 is imaged substantially sharply on the radiation-sensitive surface 42 of the detector 15, while FIG. 2a shows the operating mode corresponding to FIG. 1a in which a diffraction plane 45 is imaged substantially sharply on the radiation-sensitive surface 42.

For representing the secondary electron beam 13 in FIGS. 2a and 2b, angular trajectories are shown in full lines and field trajectories in dashed lines. Angular trajectories 47 start from the object plane 7 on the optical axis 39 at an angle with respect to the optical axis 39, and field trajectories 49 start from the object plane 7 at a distance from the optical axis 39 and parallel to the same.

It is evident from the beam path of FIG. 2a that the objective lens 29 collimates the secondary electron beam 13 emanating from the object plane 7 such that, after having passed through the objective lens 29, the angular trajectories 47 emanating at different angles from the object plane 7 travel substantially parallel to the optical axis 39. The field trajectory 49 intersects the optical axis 39 in a diffraction plane 45 which is conjugated to the object plane and thus also a cross-over plane.

Further, the transfer lens 25 then focuses the secondary electron beam 13 such that an intermediate image 51 of the object plane 7 is formed in a plane 51 downstream of the transfer lens 25. The angular trajectories 47 intersect the optical axis 39 in plane 51, and the field trajectory 49 travels besides the optical axis 39.

As far as illustrated above, the beam paths of FIGS. 2a and 2b, i.e., the beam paths in the two operating modes, are identical.

In the second operating mode shown in FIG. 2b, the projecting lens 43 is energized to focus the secondary electron beam 13 downstream of the intermediate image plane 51 such that the angular trajectories 47 intersect again the optical axis in the image plane 42 so that an image of the intermediate image plane 51 and of the object plane 7 is formed in the image plane 42. The field trajectory 49 intersects the image plane 42 at a distance from the optical axis 39 which is larger than the distance of the field trajectory 49 from the optical axis 39 in the object plane 7. Accordingly, a magnified image of the object plane 7 is formed in the image plane 42.

In the first operating mode shown in FIG. 2a, the projecting lens 43 is less energized as compared to the second operating mode so that the angular trajectories 47 which travel away from each other downstream of the intermediate image plane 51 extend substantially in parallel after they have passed through the transfer lens 25, whereas the field trajectory 49 intersects the optical axis 39 in the image plane 42. This means that two angular trajectories 47 leaving the object plane 7 at different angles to the optical axis 39 impinge on the image plane 42 or the position-sensitive detector at different positions. As a result, an image of the angular distribution of the secondary electrons emanating from the object plane 7 is generated on the detector 15.

The circumstance that, in this operating mode, the diffraction plane 45 is imaged substantially sharply on the image plane 42 is evident from the fact that the trajectory (field trajectory 49), which emerges from the diffraction plane 45 on the optical axis 39 and at an angle thereto, again intersects the optical axis 39 in the image plane 42. In addition, the trajectories (angular trajectories 47), which leave the diffraction plane 45 at a distance from the optical axis 39 and parallel thereto also impinge on the image plane at a distance from the optical axis 39.

If, in the electron microscope 1, the secondary electron intensity detected by the detector 15 is not evaluated in position-resolved manner and merely the integral electron intensity detected by the detector 15 is used for the evaluation, such an operating mode corresponds to that of the conventional scanning electron microscope (SEM). The controller 37 will then allocate the integrally detected electron intensity in an image to a position which corresponds to the location of the focal point and primary electron beam spot 35 in the object plane 7.

The additional information obtained by the use of the position-sensitive detector 15 is useful for the interpretation of the structure of the inspected object 3. In the two operating modes according to FIGS. 1a and 1b, it is possible to selectively inspect the angular distribution or the position distribution of the secondary electrons emanating from the object plane 7.

The secondary beam path 19 further comprises a beam deflector 44 which is disposed in the embodiment between the beam splitter 21 and the projecting lens 43. The beam deflector 44 is controlled by the controller 37 in order to compensate for influences which are caused in the secondary electron beam 13 due to the scanning of the primary electron beam by means of the deflector 27, such that a steady and still image is generated on the detector 15 in the object plane, which image is independent of the deflection of the primary beam.

In this respect, it is also possible to provide a double deflector rather than the single deflector 44 shown in FIGS. 1a and 1b. The double deflector would comprise two deflectors spaced apart from each other in beam direction in order to generate the image on the position-sensitive detector such that is independent of the deflection of the primary electron beam on only at a same position.

Figure 3:
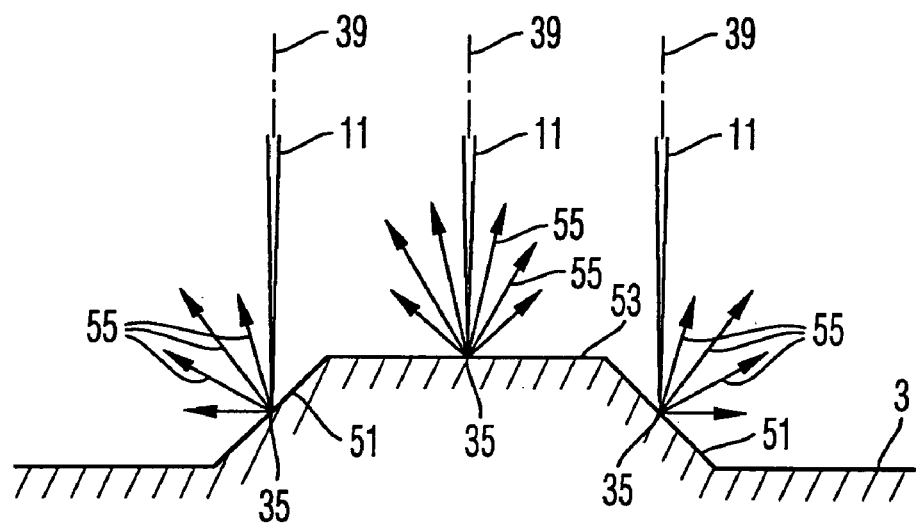
FIG. 3 is a sketch for illustrating an angular distribution of secondary electrons at an object.

FIG. 3 shows a portion of an inspected object 3 which has a structured surface with flanks 51 and a plateau 53.

FIG. 3 shows three situations. In one situation, the primary electron beam 11 is directed to the object 3 such that the focus 35 is formed on the plateau 53. In a further situation the focus 35 is formed on the left flank 51, and in a still further situation, the spot is formed on the right flank 51. Arrows 55 in FIG. 3 are representative of secondary electrons induced by the primary electrons.

If the primary electron beam 11 impinges on a horizontally oriented surface, such as the plateau 53, an angular distribution of the secondary electrons 55 emerging from the object 3 is substantially symmetric in respect of the optical axis 39.

Figure 4:
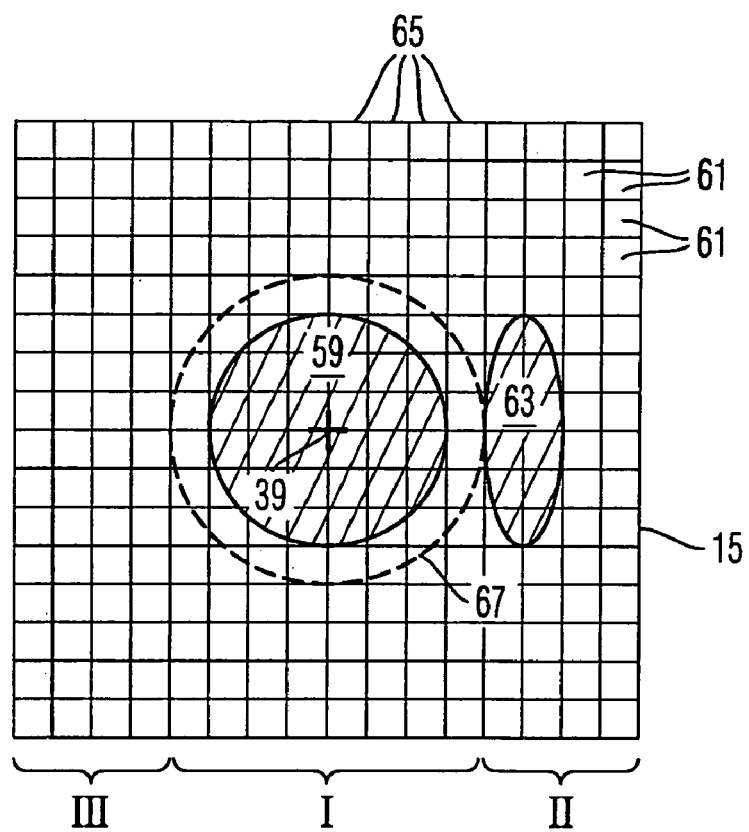
FIG. 4 is a schematic representation of position-dependent secondary electron intensities detected at the object shown in the sketch of FIG. 3.

The secondary electrons then impinge on a region of the position-sensitive detector 15 which is designated by reference numeral 59 in FIG. 4. FIG. 4 schematically shows a radiation-sensitive surface or image plane 42 of the position-sensitive detector 15. The detector 15 comprises in the image plane 42 a plurality of radiation-sensitive elements or pixels 61 which are disposed as two-dimensional array in the plane 42. The detector integrates electron intensities which impinge on each one of pixels 61. The intensities detected and integrated by each pixel 61 during a period of time can be read out by the controller 37. The optical axis 39 intersects the detector 15 or its field of pixels 61 at a center thereof so that the region 59 on which the secondary electrons emanating from a horizontal surface 53 impinge on the detector 15 is likewise centered with respect to the axis 39.

The secondary electrons 55 which are emitted from the left flank 51 of FIG. 3 have an angular distribution having a maximum which is located on the left-hand side of the optical axis 39. These secondary electrons are guided through the secondary electron optics 19 to the detector 15 such that they impinge thereon on the right-hand side of the optical axis 39. Thus, a main intensity of these secondary electrons impinges on the image plane 42 in a region 63 shown in FIG. 4. Secondary electrons 45 which emanate from the right flank 51 of FIG. 3 impinge on the detector 15 on the left-hand side of the optical axis 39.

It is evident from FIG. 4 that the evaluation of the position information of the detector 15 in the first operating mode according to FIGS. 1a and 2a provides valuable information about the angular distribution of the secondary electrons emitted from the object 3. From the position dependency of the secondary electron intensities in the image plane 42 information on a surface topography of the object may be derived. For instance, inclined surfaces may be distinguished from non-inclined surfaces.

Since for each object point it is not, as in a conventional SEM, merely an integral secondary electron intensity which is to be processed by the controller 37, but the plurality of pixels 51 of the detector 15 which must be read out for each location on the object plane 7 scanned by the primary electron beam, this requires an increased expenditure in data processing.

This can be simplified by reading out the pixels 61 of the detector 15 integrally in columns, and combining plural columns 65 to groups I, II, III (see FIG. 4). The integral secondary electron intensities of the columns 65 of each group are summed up to provide a respective signal. Accordingly, the controller 37 merely needs to process three electron intensities in order to discriminate between horizontal surfaces and flanks inclined to the left or to the right. The integral signal of group I has a high value when the primary electron beam 11 is incident on a horizontal surface or on plateau 53. A difference between the integral intensities of groups II and III has a higher value when the primary electron beam 11 impinges on flank 51, wherein the algebraic sign of such difference indicates the orientation of the flank.

Furthermore, it is for example possible to combine those pixels 61 which are located within circular line 67 in FIG. 4 to a group and to sum up the detected intensities of this group 67. This is based on the consideration that for horizontal surfaces a more precise angular resolution of the secondary electrons will not be necessary and the data amount reduced by the summation is sufficient for characterizing the structure of the object.

By selecting such regions 67, which can also be of ring shape about the optical axis 39, it is also possible to simulate a function of an aperture stop, resulting in a "virtual aperture".

When the primary electron beam 11 impinges on a crystalline region of the object 3, it is also known that the secondary electrons have a specific angular distribution which is determined by the crystal structure. There are then characteristic angular values for the crystalline material at which high secondary electron intensities occur. These high intensities which occur at specific angles are also referred to as Bragg peaks.

Figure 5:
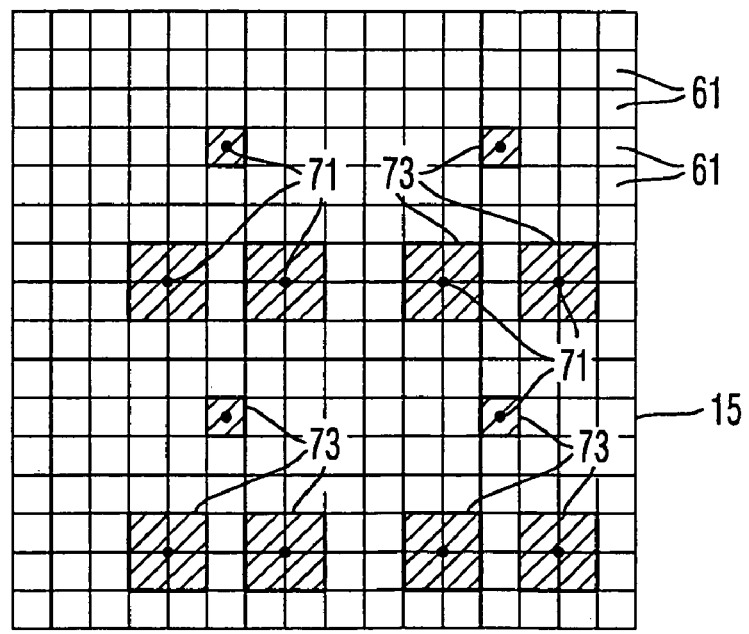
FIG. 5 is a representation similar to FIG. 4 for a further object.

This is schematically shown in FIG. 5. In this FIG., filled circles 71 indicate the positions of such Bragg peaks in the image plane 42. In order to detect the intensities of these peaks, not all pixels 61 of the detector 15 are read out by the controller 37. Merely those pixels 61 are read out which are located within regions 73 surrounding the positions of the peaks 71. This will also reduce the amount of data to be processed.

Figure 6:
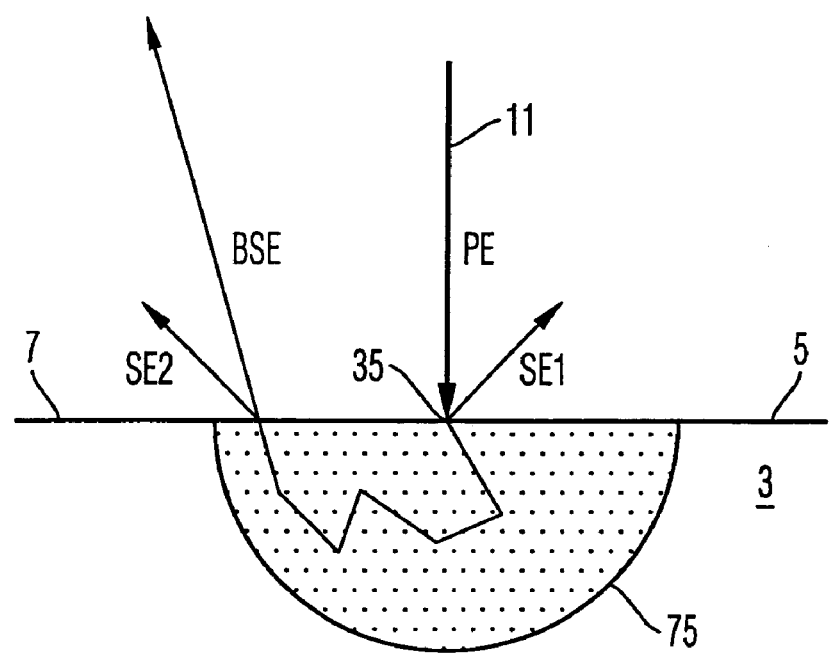
FIG. 6 illustrates position dependencies of generated secondary electrons.

FIG. 6 illustrates mechanism of generating secondary electrons. Primary electrons of a primary electron beam 11 impinging on the surface 5 of the object 3 at beam spot 35 release a secondary electron SE1 directly at the object surface 5 by an inelastic interaction. The secondary electron SE1 emanates from the point of incidence of the primary electron beam 11. Further, primary electrons PE penetrate into the object 3, undergo there plural elastic interactions within a so-called interaction volume 75, and emerge from the object at a distance from the focus 35 as backscattering electrons BSE, wherein further secondary electrons SE2 are released from the object 3 due to scattering. The secondary electrons SE2 emerge from the object also at a distance from the focus 35. The scattering processes and mechanisms occurring in the interaction volume 75 are different for different materials and are dependent, among others;, on the composition and structure of the material. This means that, by evaluating the distances from the focus 35 at which the secondary electrons emerge from the object surface 5, it is possible to draw conclusions on the structure of the inspected materials.

It is also evident therefrom that an electron emerging from the object surface 5 at a distance from the focus 35 carries information on the object both with respect to the proximity of the focus 35 and with respect to the location of emergence distant from the focus 35. In a conventional SEM, it is not possible to distinguish between an electron which emerges at the focus 35 and an electron which emerges at a distance from this focus 35. This results into a loss of resolution. With the electron microscope 1 shown in FIG. 1b, however, it is possible to discriminate these secondary electrons and the resolution can be improved in that merely electrons which emerge from the object surface 5 within a predetermined maximum radius around the focus 35 are included in the evaluation.

In the following, variants of the embodiments illustrated with reference to FIGS. 1 to 6 will be described. To this end, components which correspond in structure or function to components shown in FIGS. 1 to 6 are designated by the same reference numerals as in FIGS. 1 to 6, but supplemented by an additional letter for the purpose of distinction.

Figure 7:
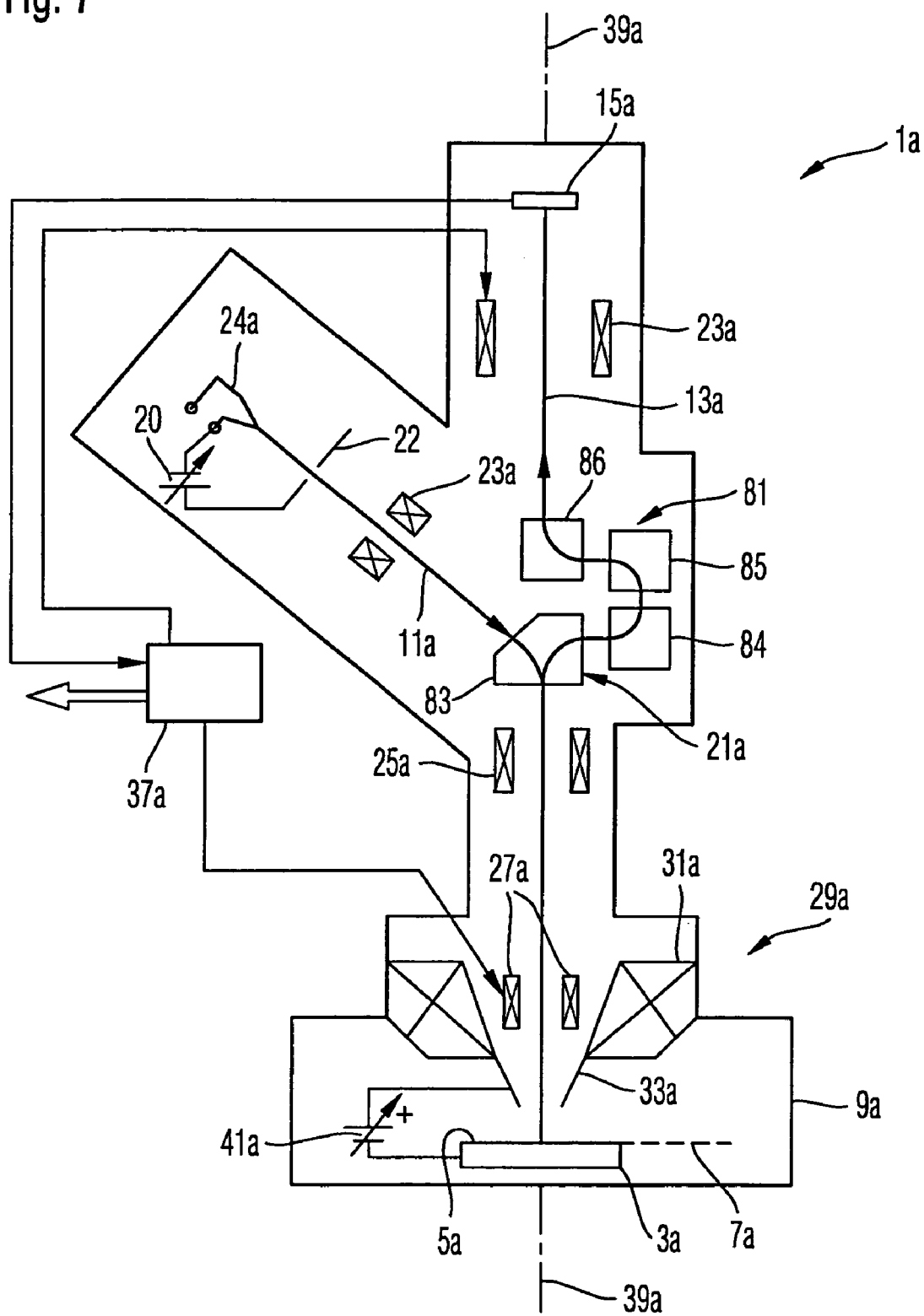
FIG. 7 shows a further embodiment of an electron microscopy system according to the invention.

An electron microscope 1a schematically shown in FIG. 7 is in structure and function similar to the electron microscope shown in FIG. 1. In contrast thereto, the electron microscope 1a according to FIG. 7 comprises an energy selector 81 which is disposed in a secondary electron optics 19a of the microscope 1a. Merely secondary electrons of a selected energy range are allowed to pass through the energy selector 81 and impinge on the position-sensitive detector 15. The energy selector 81 is provided such that it is image-preserving, i.e., it does not destroy a position information contained in a secondary electron beam 13a.

The energy selector 81 used in the microscope can be an energy selector of the so-called Ω-type, as it is known, for example, from U.S. Pat. No. 4,740,704, the full disclosure of which is incorporated herein by reference.

The energy selector comprises four field regions 83, 84, 85 and 86, the outlines of which are schematically shown in FIG. 7. These field regions are successively traversed by the secondary electron beam 13a. The first field region 83 deflects the secondary electron beam 13a by 90° to the right. The beam then enters the field region 84 which deflects the same by 90° to the left. It then enters the field region 85 which deflects the same by further 90° to the left. Finally, the secondary electron beam 13a enters the field region 86 which again deflects the same by 90° to the right. The magnetic fields provided in each one of the field regions 83 to 86 by pairs of magnetic poles are selected, as far as their strengths and spatial extensions and their arrangement relative to each other are concerned, such that the secondary electron beam passes through the energy selector 81 substantially straightly, i.e., substantially along the optical axis 39a of the objective arrangement 29a.

The first deflection field 83 for the secondary electron beam 13a in the energy selector 81 also provides a magnetic field for separating the primary electron beam 13a from the secondary electron beam 11a. Accordingly, the field region 83 of the energy filter 81 has also a function of a beam splitter 21a. The primary electron beam 11a is generated by a radiation source which comprises a cathode 21a and an anode 22 which is disposed opposite to the cathode 21a and is biased via an adjustable voltage source 20.

A projecting lens 23a provided in the beam path of the secondary electron beam 13a in front of the detector 15a is controllable by a controller 37a to switch the electron microscope 1a from a first operating mode in which the detector 15a detects an angular distribution of the secondary electrons emanating from an object plane 7a, to a second operating mode in which the detector 15a detects a position dependence of the secondary electrons emanating from the object plane 7a, as it has already been illustrated above with reference to FIGS. 1 to 6.

As already illustrated above, all electrons induced by the primary electron beam and traveling from the object towards the objective lens are referred to as secondary electrons in the present application. Accordingly, all of these types of electrons are embraced by the scope of the described application, although FIG. 6 does not illustrate "mirror electrons". However, there is also a preferred application for measurements using such mirror electrons, namely the measurement of electric fields across an object surface. In such a case, the position-resolving observation of secondary electrons of the mirror-electron type provide a direct indication of the strength and direction of electric fields generated across the object surface, by e.g. electrical circuits supplied with operating voltages.

The energy filter described with reference to the embodiment of FIG. 7 can be of the Ω-type. However, it is of course also possible to use other types of energy filters such as, for example, those which are usually referred to as energy filters of the α-type.

As a variant of the above-described embodiments it is conceivable to replace the electron source and the primary electron beam by a source and a beam, respectively, of another energy type which can likewise be focused substantially at a point in the object plane. Examples thereof are a photon beam or an ion beam.

The present invention has been described by way of exemplary embodiments to which it is not limited. Variations and modifications will occur to those skilled in the art without departing from the scope of the present invention as recited in the appended claims and equivalents thereof.

What is claimed is:

1. An electron microscopy system for inspecting an object positionable in an object plane of the electron microscopy system, the system comprising:
    an electron source for generating a primary electron beam;
    primary electron optics having an objective lens for focusing the primary electron beam to form a primary electron beam spot which is substantially a point spot in the object plane, and a controllable first beam deflector for deflecting the primary electron beam relative to the objective lens for scanning the primary electron beam spot across the object plane;

an electron detector for detecting an electron intensity, wherein the electron detector is a two-dimensionally position-sensitive detector;

secondary electron optics including the objective lens, for transferring secondary electrons emanating from the object plane in a region around the primary electron beam spot as a secondary electron beam to the electron detector, and a controller for receiving signals from the electron detector and for allocating the received signals to a position in an image based upon a location of the primary electron beam spot in the object plane.

2. The electron microscopy system according to claim 1, further comprising a beam splitter disposed in the primary electron optics between the electron source and the objective lens and in the secondary electron optics between the objective lens and the electron detector.

3. The electron microscopy system according to claim 2, wherein the secondary electron optics further comprises an energy filter disposed in the beam path of the secondary electron beam between the objective lens and the electron detector.

4. The electron microscopy system according to claim 1, wherein the secondary electron optics is configured such that the object plane is imaged substantially sharply on the electron detector.

5. The electron microscopy system according to claim 1, wherein the secondary electron optics is configured such that a diffraction plane conjugated to the object plane in the secondary electron optics is imaged substantially sharply on the electron detector.

6. The electron microscopy system according to claim 5, wherein the secondary electron optics is switchable between a first mode setting for imaging the object plane substantially sharply on the electron detector, and a second mode setting for imaging the diffraction plane substantially sharply on the electron detector.

7. The electron microscopy system according to claim 6, further comprising a controller for energizing at least one further imaging lens of the secondary electron optics in dependence of the first and second mode settings.

8. The electron microscopy system according to claim 1, wherein a diameter of the primary electron beam spot is less than 500 nm.

9. An electron microscopy system for inspecting an object positionable in an object plane of the electron microscopy system, the system comprising:

an electron source for generating a primary electron beam;

primary electron optics for providing a primary electron beam path from the electron source to the object plane, the primary electron optics including a beam splitter, an objective lens downstream of the beam splitter in the primary electron beam path, for focusing the primary electron beam to form a primary electron beam spot in the object plane, and a first beam deflector downstream of the beam splitter in the primary electron beam path, for deflecting the primary electron beam relative to the objective lens;

an electron detector for detecting an electron intensity, wherein the electron detector includes an array of detector pixels;

secondary electron optics for providing a secondary electron beam path from the object plane to the detector, the secondary electron optics including the objective lens, the first beam deflector, the beam splitter downstream of the objective lens and the first beam deflector in the secondary electron beam path, and a second beam deflector downstream of the beam splitter in the secondary electron beam path; and a controller for controlling the first beam deflector for adjusting a deflection of the primary electron beam relative to the objective lens, and for controlling the second beam deflector in dependence on the deflection of the primary electron beam.

10. A scanning-electron-microscopy-type apparatus providing a primary electron beam path and a secondary electron beam path, comprising:

an electron source;

a beam splitter, an objective lens, and a first beam deflector, each disposed in the primary electron beam path and in the secondary electron beam path;

a second beam deflector and an electron detector, each disposed in the secondary electron beam path and outside the primary electron beam path; and a controller for operating the second beam deflector in dependence on a deflection provided by the first beam deflector.

11. A method for inspecting an object to obtain structure information of the object, the method comprising:

generating a primary electron beam spot on the object by directing a finely focused primary electron beam onto the object;

scanning the primary electron beam spot relative to the object;

obtaining a secondary electron image with a two-dimensionally position-sensitive detector; and obtaining the structure information from the secondary electron image, the structure information corresponding to a location of the scanned primary electron beam spot at a given time.

12. The method according to claim 11, wherein the analyzed image is an image of an object plane at which the object is positioned.

13. The method according to claim 11, wherein the analyzed image is an image of a diffraction plane conjugate to the object plane at which the object is positioned.

14. The method according to claim 11, further including obtaining image information of the secondary electron image from only a subset of a plurality of pixels of a position sensitive electron detector.

15. A method for inspecting an object, the method comprising:

generating a primary electron beam spot on the object by directing a primary electron beam onto the object through an objective lens;

deflecting the primary electron beam relative to the objective lens;

separating from the primary electron beam a secondary electron beam emanating from the primary electron beam spot;

deflecting the separated secondary electron beam relative to the detector in dependence on a deflection of the primary electron beam; and detecting an intensity of the separated secondary electron beam with a detector.

16. The method according to claim 15, wherein the deflection of the secondary electron beam compensates for a deterioration of the detected intensities caused by the deflection of the primary electron beam.

17. A scanning-electron-microscopy-type apparatus, comprising:
- a source of primary electrons;
- a beam splitter, an objective lens, and a first beam deflector, each disposed to receive the primary electrons and to receive secondary electrons emanating from an object impinged by the primary electrons;
- a second beam deflector and an electron detector, each disposed to receive the secondary electrons and not to receive the primary electrons; and
- a controller for operating the second beam deflector in dependence on a deflection of the primary electrons provided by the first beam deflector.

18. A method for inspecting an object, the method comprising:
- generating primary electrons and directing the primary electrons onto an object through an objective lens;
- deflecting the primary electrons relative to the objective lens with a first beam deflector;
- separating from the primary electrons secondary electrons emanating from the object impinged by the primary electrons
- deflecting the separated secondary electrons relative to the detector with a second beam deflector in dependence on a deflection of the primary electrons; and
- detecting an intensity of the separated secondary electrons.

* * * * *